United States Patent
Wohlfarth

(10) Patent No.: US 7,397,245 B2
(45) Date of Patent: Jul. 8, 2008

(54) SURFACE COIL ARRANGEMENT FOR MAGNETIC RESONANCE TOMOGRAPHS

(75) Inventor: Katrin Wohlfarth, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/503,315

(22) Filed: Aug. 11, 2006

(65) Prior Publication Data
US 2007/0040555 A1 Feb. 22, 2007

(30) Foreign Application Priority Data
Aug. 19, 2005 (DE) ............ 10 2005 039 380

(51) Int. Cl.
*G01V 3/00* (2006.01)
(52) U.S. Cl. ............................ 324/318; 324/321
(58) Field of Classification Search ......... 324/318–322, 324/307, 309; 600/410, 422; 333/227, 233
See application file for complete search history.

(56) References Cited

U.S. PATENT DOCUMENTS

| | | | | |
|---|---|---|---|---|
| 6,591,128 B1 * | 7/2003 | Wu et al. | ................ | 600/422 |
| 6,750,653 B1 * | 6/2004 | Zou et al. | ................ | 324/318 |
| 6,784,665 B1 * | 8/2004 | Chan et al. | ................ | 324/318 |
| 6,788,057 B1 * | 9/2004 | Petropoulos et al. | ........ | 324/318 |
| 6,930,481 B2 * | 8/2005 | Okamoto et al. | ............ | 324/318 |
| 6,998,843 B2 * | 2/2006 | Okamoto et al. | ............ | 324/318 |
| 7,009,398 B2 * | 3/2006 | Hahn et al. | ................ | 324/318 |
| 7,109,713 B2 * | 9/2006 | Okamoto et al. | ............ | 324/318 |
| 7,227,361 B2 * | 6/2007 | Okamoto et al. | ............ | 324/318 |
| 2003/0094948 A1 * | 5/2003 | Okamoto et al. | ............ | 324/318 |
| 2004/0066195 A1 | 4/2004 | Reykowski | ................ | 324/319 |
| 2004/0257081 A1 * | 12/2004 | Hahn et al. | ................ | 324/318 |
| 2005/0122113 A1 * | 6/2005 | Okamoto et al. | ............ | 324/318 |
| 2005/0245805 A1 * | 11/2005 | Hoppel et al. | ............... | 600/407 |
| 2005/0264292 A1 * | 12/2005 | Okamoto et al. | ............ | 324/318 |
| 2007/0040555 A1 * | 2/2007 | Wohlfarth | ................ | 324/318 |

FOREIGN PATENT DOCUMENTS

| | | |
|---|---|---|
| EP | 1 521 094 | 4/2004 |
| GB | 2 350 682 | 12/2000 |
| WO | WO 03/025607 | 3/2003 |

* cited by examiner

*Primary Examiner*—Brij Shrivastav
*Assistant Examiner*—Tiffany A Fetzner
(74) *Attorney, Agent, or Firm*—Schiff Hardin LLP

(57) ABSTRACT

A surface coil arrangement of a gradient system for an MR tomography apparatus has coil elements mounted on a first antenna, the antenna being extendable by at least one further antenna that likewise includes an arrangement of at least one coil element, and which is detachably or movably fastened to the first antenna.

5 Claims, 2 Drawing Sheets

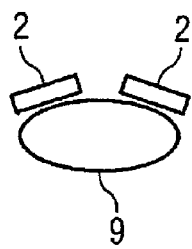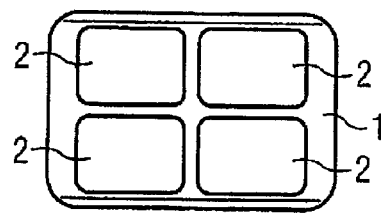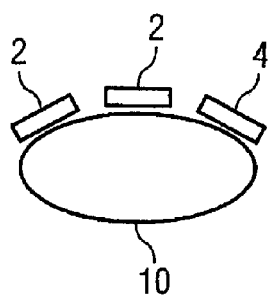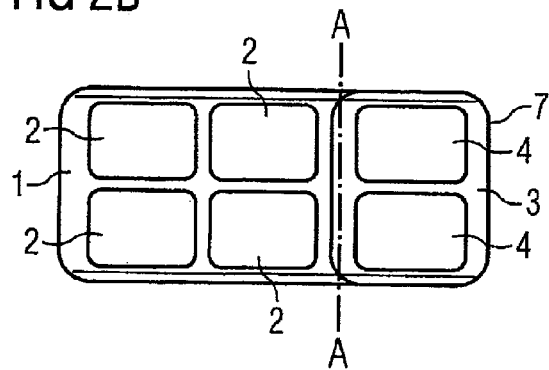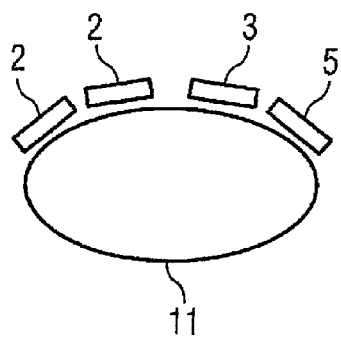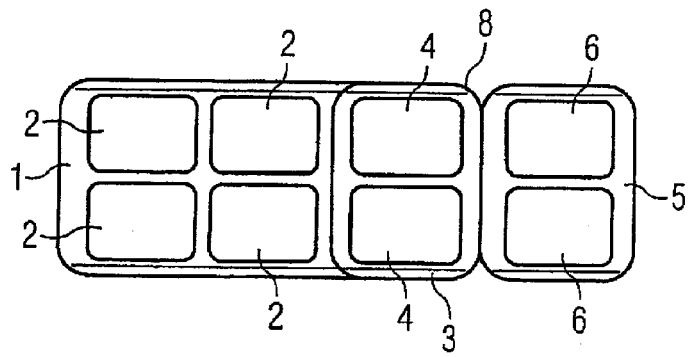

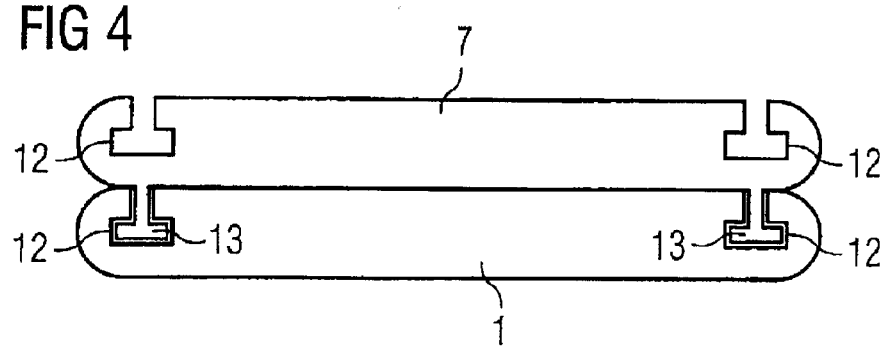
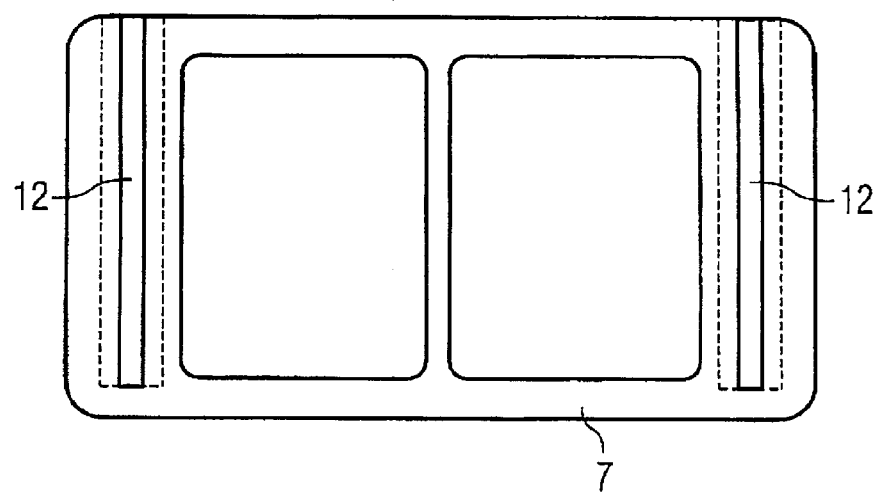
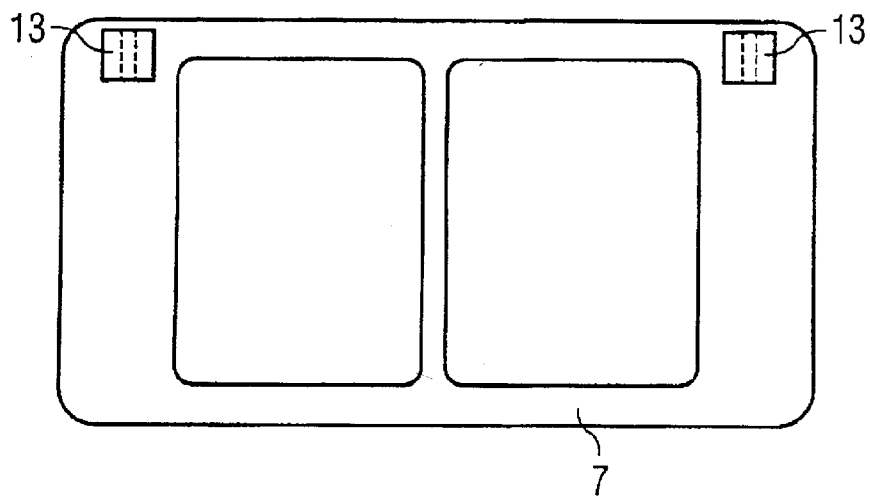

SURFACE COIL ARRANGEMENT FOR MAGNETIC RESONANCE TOMOGRAPHS

BACKGROUND OF THE INVENTION

1. Field of the Invention

The present invention concerns a surface coil arrangement for a magnetic resonance tomography of the type wherein an arrangement of coil elements is mounted on an antenna, and wherein the antenna can be extended in size by at least one further antenna element that likewise carries an arrangement of at least one coil element.

2. Description of the Prior Art

A surface coil arrangement of the above general type is known from PCT Application WO 03/025607 A1.

Such surface coil arrangements are used in magnetic resonance tomography (MRT), as reception coil systems and possibly at the same time as transmission coils, for which purpose they are placed directly at the region to be examined on the body surface of a patient examined in the MR tomography apparatus. The examination subject is thereby exposed essentially from only one side, i.e., signals are acquired only on one side. In order to counteract the decay of the signal intensity that occurs with increasing distance from the reception coil, arrangements known as "array coils" are used, meaning an arrangement of a number of reception coils. A number of reception coils are operated simultaneously in such an arrangement. The signals of the individual coils (array channels) are supplied to separate receivers and an image is initially calculated for each array channel. These images are then added using suitable combination logarithms, and an image with a large measurement field and a high signal/noise ratio is created. These array coils are suite, for example, for spinal column examinations in which the spinal column can be completely mapped without coil exchange or coil displacement. Coils known as body coils that are situated very close to the body and are used in abdomen or back imaging are a further application.

Conventional body array coils are known that are designed for placement on an average patient body. MR acquisitions in a plane perpendicular to the body axis of the patient depend essentially on the "patient body circumference". This varies from patient to patient, for example as a result of obesity, pregnancy or even because the patient is an infant.

If the patient is obese or if the patient is a pregnant woman, the sides of the patient are not covered by the body array. This leads to a signal discontinuity in the middle of the body of the patient. By contrast, if the patient is extremely thin or a child, the coil is too large for the patient. The coil edges rest on the examination table; the coil cannot be optimally fixed.

WO 03/025607 A1 describes a surface coil arrangement of a gradient system for MR tomography in which a number of coil elements are arranged next to one another. The coil elements are attached to one another without overlap by latches or snaps or the like. A step-by-step adaptation to the circumference of the measurement region to be examined can thereby ensue. Nevertheless, due to fit inaccuracies poorly-exposed areas or poorly-received signals still can occur when the coil arrangement is not situated entirely surrounding the body of the person to be examined because it is too large or does not fully cover the body region because it is too small.

EP 1 521 094 A1 describes a similar arrangement in which a large number of coil elements are mechanically connected with one another, arranged in columns and rows.

DE 102 44 173 describes with an antenna arrangement for magnetic resonance apparatuses in which an inductive coupling of adjacent antenna groups is effected. If the patient is obese or if the patient is a pregnant woman, the sides of the patient are not covered by the body array. A signal discontinuity in the middle of the body of the patient thus occurs.

SUMMARY OF THE INVENTION

An object of the present invention is to provide a surface coil arrangement of the above type that allows a variable adaptation to be made to the individual proportions in the region of a patient to be examined.

The above object is achieved in accordance with the principles of the present invention by a surface coil arrangement of the above type, wherein the (at least one) further antenna is attached to the basic antenna by slide rails, so that the overall coil arrangement can be extended or shortened by telescoping or pushing together the further antennas in one direction.

Under certain circumstances, this will result in an arrangement wherein one antenna arrangement overlaps another, in which case the individual coil elements of the overlapping antenna can be deactivated to prevent foldover artifacts in the resulting magnetic resonance image.

DESCRIPTION OF THE DRAWINGS

FIG. 1a schematically illustrates the placement of a known body array on a small patient body.

FIG. 1b shows the associated body array of FIG. 1a, schematically in a plan view.

FIG. 2a shows an embodiment of an inventive extended body array on a patient body of average circumference, in cross-section.

FIG. 2b shows the inventive extended body array of FIG. 2b in a plan view.

FIG. 3a shows a further enlarged embodiment of an inventive body array on a patient body with a large circumference, in cross-section.

FIG. 3b shows the associated inventive extended body array in a plan view.

DESCRIPTION OF THE PREFERRED EMBODIMENTS

FIG. 1a schematically shows a cross-section through a region 9 of a patient body to be examined, on which region 9 a known surface coil arrangement (in the following: body array) rests. In this section one sees two coil elements 2 can be seen that, given the shown body cross-section 9, are adequate to expose this sufficiently or to acquire signals.

FIG. 1b shows the body array in a plan view. Two coil elements 2 are respectively arranged in two rows on an antenna 1 such that they likewise form two columns. The antenna 1 can be formed of a flexible material in order to be able to better adapt it to the body contours, can be formed of comprise a rigid material that has a curved shape adapted to the body contour.

FIG. 2 shows an inventive extended body array in which (as can be seen in FIG. 2b) a further body array 3 with a frame 7 with coil elements 4 that are arranged in a column at the right side, overlapping the antenna 1 according to FIG. 1b. As can be seen in FIG. 2a, a patient body cross-section 10 that is larger than the patient body cross-section 9 in FIG. 1a is again sufficiently exposed, such that sufficient signals can be acquired from the patient body.

FIG. 3a shows an even larger patient cross-section 11, possibly caused by obesity or pregnancy. In this case a further antenna 5 is arranged on the extension antenna 3. This further antenna 5 has coil elements 6 that are again arranged in a column. The antenna 5 can exhibit the same shape and the same dimensions as the antenna 3; but this is not necessary. It is likewise possible to arrange the further antenna 5 in FIG. 3b on the left side of the first antenna 1.

Since the present invention deals essentially with the geometric arrangement and extension of a body array, the likewise-necessary electrical connection of the additional coil elements is not described. It is clear to those of ordinary skill in the antenna design that measures must be taken in order to integrate the additional coil elements into the measurement arrangement.

According to the invention, the additional antennas 3, 5 are connected with the primary antenna 1 or to one another by process of a slide rail system 8. The body array thus can be individually adapted to the body circumference of the patient to be examined via shifting the further antennas 3, 5 along the long sides of the antenna 1. FIG. 4 shows a cross-section taken along A-A in FIG. 2b with the array 3 overlapping the antenna 1.

The slide rail system 8 at the facing surfaces of the antenna 1 and the frame 7 of the array 3, two grooves 12 arranged parallel to each other in the left and right frame parts. These grooves 12 are open towards the upper surface of the frame of the antenna 1 with a reduced width compared 1) their with in their lower section. On the lower surface of the frame 7 complementary projections 13 are provided to fit in the grooves 12. The grooves 12 are accessible on one end as they are open and on the other end they are closed to form a stop. The frame 7 also has grooves 12 in its upper surface, so as to receive projections at the bottom surface of the further antenna 5 (if used) in the same manner.

FIGS. 5a and 5b show the upper and lower surfaces of the frame 7 with its grooves 12 and projections 13, respectively.

It should be noted that thus can lead to overlaps of coil elements in the radial direction (viewed from the body axis of the patient). In order to eliminate or to minimize imaging artifacts that can occur due to such an overlap, at least one of the overlapping coil elements can be wholly or partially deactivated.

With the surface coil arrangement according to the present invention, a body array can be individually adapted to the body circumference of a patient to be examined, such that in each case image signals can be acquired with optimal contrast and optimal signal/noise ratios.

Although modifications and changes may be suggested by those skilled in the art, it is the intention of the inventor to embody within the patent warranted hereon all changes and modifications as reasonably and properly come within the scope of her contribution to the art.

I claim as my invention:

1. A surface coil arrangement configured for a magnetic resonance gradient system, comprising:
   a base antenna having an arrangement of a plurality of coil elements;
   at least one further antenna forming a magnetic resonance surface coil with said base antenna, said further antenna comprising a plurality of coil elements, and being moveably attached to said base antenna by slide rails in order to extend said base antenna by telescoping along one direction, said further antenna, via said slide rails, being moveable between a first position wherein the coil elements of the further antenna overlap and coincide with the coil elements of said base antenna and a second position wherein there is no overlap of the coil elements of the further antenna and the coil elements of the further antenna so as to allow said base antenna and said further antenna to conform to a surface contour of an examination subject, with respective coil elements of said further antenna or said base antenna being deactivable in order to prevent foldover artifacts when said further antenna is in said position.

2. A surface coil arrangement as claimed in claim 1, wherein said base antenna has a rectangular shape, and comprises two and two columns rows each having two coil elements therein.

3. A surface coil arrangement as claimed in claim 2 wherein said further antenna comprises one column having two coil elements therein.

4. A surface coil arrangement as claimed in claim 1 wherein said further antenna is a first further antenna, and comprising a second further antenna, substantially identical to said first further antenna, attached to said first further antenna by slide rails in order to further extend said base antenna by telescoping along said one direction, said second further antenna being movable via said slide rails between said first position, wherein coil elements of said second further antenna overlap and coincide with the coil elements of the base antenna and the coil elements of the first further antenna, and said second position, wherein coil elements of said second further antenna overlap and coincide with the coil elements of said first further antenna, and a third position wherein there is no overlap of the coil elements of said further antenna with the coil elements of the first further antenna or the coil elements of said base antenna.

5. A surface coil arrangement as claimed in claim 1 wherein said base antenna has a rectangular shape and comprises two rows and two columns each having two coil elements therein, and wherein each of said first further antenna and said second further antenna comprises one column with two coil elements therein.

* * * * *